United States Patent
Amemiya et al.

(12)

(10) Patent No.: US 6,417,147 B2
(45) Date of Patent: Jul. 9, 2002

(54) CLEANING AGENT COMPOSITION, METHOD FOR CLEANING AND USE THEREOF

(75) Inventors: Masahiro Amemiya; Satoshi Saito; Katsuji Yano, all of Fukushima; Kunio Matsuki, Kanagawa, all of (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/794,620

(22) Filed: Feb. 28, 2001

Related U.S. Application Data
(60) Provisional application No. 60/241,839, filed on Oct. 20, 2000.

(30) Foreign Application Priority Data

Feb. 29, 2000 (JP) ......................................... 2000-054670
Aug. 22, 2000 (JP) ......................................... 2000-250540

(51) Int. Cl.[7] ............................. H01L 21/02; C23G 1/18
(52) U.S. Cl. ...................... 510/175; 510/176; 510/504; 510/245; 134/2; 134/3; 134/13; 134/42; 438/906; 430/905

(58) Field of Search ................................. 510/176, 175, 510/504, 245; 134/2, 42, 3, 13; 438/906; 430/905

(56) References Cited

U.S. PATENT DOCUMENTS 5,498,293 A * 3/1996 Ilardi et al.
6,152,148 A * 11/2000 George et al.
6,265,309 B1 * 7/2001 Gotoh et al.

* cited by examiner

*Primary Examiner*—Yogendra N. Gupta
*Assistant Examiner*—Gregory E. Webb
(74) *Attorney, Agent, or Firm*—Sughrue Mion, PLLC

(57) ABSTRACT

An object of the present invention is to provide a new cleaning agent composition having excellent cleaning power for the surface contamination of a semiconductor wafer or various precisely worked instruments made of glass or ceramic, which is used in the manufacture of wafer; a method for cleaning a wafer; a semiconductor wafer having a surface cleaned by a cleaning method; and a method for manufacturing a semiconductor wafer. A semiconductor wafer is cleaned using a cleaning agent composition including a specific fluorine-containing anionic surfactant, a quaternary ammonium hydroxide and/or an alkanolamine.

13 Claims, No Drawings

CLEANING AGENT COMPOSITION, METHOD FOR CLEANING AND USE THEREOF

CROSS REFERENCE TO RELATED APPLICATIONS

This application is an application filed under 35 U.S.C. §111(a) claiming benefit pursuant to 35 U.S.C. §119(e)(1) of the filing date of Provisional Application 60/241,839 filed Oct. 20, 2000 pursuant to 35 U.S.C. §111(b).

FIELD OF THE INVENTION

The present invention relates to a cleaning agent composition for use in removing contamination on the surface of a semiconductor wafer or a precisely worked instrument made of glass, ceramic or the like, which is used in the manufacture of a wafer. In addition, the present invention also relates to a method for cleaning a semiconductor wafer, a semiconductor wafer and a method for manufacturing a semiconductor wafer.

BACKGROUND OF THE INVENTION

Semiconductor devices such as transistor, diode, IC, LSI and rectifying element are manufactured by applying steps such as growth in vapor phase, formation of oxide film, diffusion of impurities and vapor deposition of electrode metal film, to a silicon wafer or a compound semiconductor wafer.

The electric properties of a semiconductor device are conspicuously affected by impurities, and therefore, the semiconductor wafer surface is thoroughly cleaned to remove contamination with impurities before applying the respective steps described above. As industrial means therefor, a large number of methods using a treating solution mainly comprising an organic alkali or a treating solution obtained by adding a complexing agent, a surfactant, a hydrogen peroxide and the like to an organic alkali have been proposed.

JP-A-50-147287 (the term "JP-A" as used herein means an "unexamined published Japanese patent application") describes the fact that sole use of, for example, tetramethylammonium hydroxide (hereinafter referred to as "TMAH") out of tetraalkylammonium hydroxides is effective in the degreasing, removal of contamination with inorganic substances and removal of ultra-thin oxide layer. However, (1) due to poor wettability to the surface to be treated, the cleaning power is not sufficiently high, and (2) etching activity depends on the orientation of silicon crystal (that is, the (100) plane is readily etched, whereas the (111) plane has resistance against the etching activity and in the case of a (100) mirror face wafer, this plane is roughened due to etching). Thus, improvement is still needed.

JP-A-50-158281 describes a solution obtained by adding a complexing agent to TMAH. In this case, the cleaning power may be improved as compared with the sole use of TMAH; however, the wettability to the surface to be treated is poor and the cleaning power is still insufficient.

With respect to the etching of silicone crystal, the addition of only a surfactant to an aqueous alkali solution may have an effect of preventing etching of silicone crystal. However, the effectiveness varies depending on the kind of surfactant, the alkali concentration, the temperature or the like. Therefore, a sufficiently high effect is not always ensured in all possible conditions. To cope with this, a case of using a hydrogen peroxide in addition to an alkali and a surfactant has been reported. For example, JP-A-63-274149 describes a case where etching can be satisfactorily controlled when a hydrogen peroxide is used in addition to a tetraalkylammonium hydroxide and a nonionic surfactant. This technique, however, has a problem in that the capability of removing particles is not sufficiently high.

As described in Japanese Patent 2,579,401, a case of adding an alkanolamine to a tetraalkylammonium hydroxide and a nonionic surfactant is known. By adding an alkanolamine, the cleaning power increases; however, this technique has a problem that the capability of removing particles is not sufficiently high.

With recent tends toward higher integration of semiconductors, the requirement for removing impurities is further increasing and a new cleaning solution having high effects of removing impurities, preventing re-adsorption of desorbed impurities and ensuring satisfactorily controlled etching property is being demanded.

SUMMARY OF THE INVENTION

The present invention has been made under these circumstances and an object of the present invention is to provide a cleaning agent composition having excellent cleaning power for contamination on the surface of a semiconductor wafer or various precisely worked instruments made of glass, ceramic or the like, which are used in the manufacture of semiconductor wafer. Another object of the present invention includes providing a method for cleaning a wafer, a method for manufacturing a semiconductor wafer, and a semiconductor wafer having a surface cleaned by a cleaning method.

As a result of extensive investigations to solve the above-described problems, the present inventors have found that these problems can be solved by using a cleaning agent composition comprising a specific fluorine-containing anionic surfactant, a quaternary ammonium hydroxide and/or an alkanolamine. The present invention has been accomplished based on this finding.

More specifically, an embodiment of the present invention is a cleaning agent composition comprising from 0.0001 to 5 mass % of a fluorine-containing anionic surfactant, from 0.001 to 30 mass % of a quaternary ammonium hydroxide and/or from 0.01 to 20 mass % of an alkanolamine. In a preferred embodiment of the present invention, the fluorine-containing anionic surfactant is at least one compound selected from the group consisting of carboxylic acids represented by the following formula (1):

$$R^1COOM \qquad (1)$$

wherein $R^1$ represents a linear or branched alkyl group or alkenyl group having from 2 to 20 carbon atoms, with a part or all of hydrogen atoms being substituted by fluorine atom, and M represents a hydrogen atom, an alkali metal atom, an ammonium group, an alkylammonium group or an alkanolammonium group, salts thereof, sulfonic acids represented by the following formula (2):

$$R^2SO_3M \qquad (2)$$

wherein $R^2$ represents a linear or branched alkyl group or alkenyl group having from 2 to 20 carbon atoms, with a part or all of hydrogen atoms being substituted by fluorine atom, and M has the same meaning as defined above, and salts thereof, and in a more preferred embodiment, the fluorine-containing anionic surfactant is at least one compound selected from the group consisting of perfluorocaprylic acid, perfluorocapric acid, perfluorooctane sulfonic acid and salts thereof.

Also, in a preferred embodiment, the quaternary ammonium hydroxide is at least one compound selected from the group consisting of compounds represented by the following formula (3):

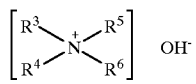 (3)

wherein $R^3$, $R^4$, $R^5$ and $R^6$, which may be the same or different, each independently represents an alkyl group having from 1 to 6 carbon atoms or a hydroxyalkyl group, and in a more preferred embodiment, the quaternary ammonium hydroxide is tetramethylammonium hydroxide.

Also, in a preferred embodiment, the alkanolamine is at least one compound selected from the group consisting of compounds represented by the following formula (4):

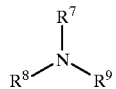 (4)

wherein $R^7$ represents a hydroxyalkyl group having from 1 to 4 carbon atoms, $R^8$ and $R^9$, which may be the same or different, each independently represents a hydrogen atom, an alkyl group having from 1 to 4 carbon atoms, a hydroxyalkyl group having from 1 to 4 carbon atoms or an aminoalkyl group having from 1 to 4 carbon atoms, and $R^8$ and $R^9$ may combine to represent an alkylene group having from 3 to 6 carbon atoms, which may be interrupted by an oxygen atom or a nitrogen atom, and in a more preferred embodiment, the alkanolamine is at least one compound selected from the group consisting of monoethanolamine, diethanolamine and triethanolamine.

In a preferred embodiment of the present invention, the composition contains from 0.0001 to 5 mass % of a nonionic surfactant, and in a more preferred embodiment, the nonionic surfactant is at least one compound selected from the group consisting of polyoxyalkylene alkyl ether compounds represented by the following formula (5):

$$R^{10}-O-(R^{11}-O)_p-H \quad (5)$$

wherein $R^{10}$ represents an alkyl group having from 6 to 20 carbon atoms, $R^{11}$ represents an alkylene group having from 2 to 4 carbon atoms, and p represents an integer of 3 to 20, polyoxyalkylene aryl ether compounds represented by the following formula (6):

$$R^{12}-C_6H_4-O-(R^{13}-O)_q-H \quad (6)$$

wherein $R^{12}$ represents an alkyl group having from 6 to 20 carbon atoms, $R^{13}$ represents an alkylene group having from 2 to 4 carbon atoms, and q represents an integer of 3 to 20, and polyoxyalkylene alkyl ester compounds represented by the following formula (7):

$$R^{14}-COO-(R^{15}-O)_r-H \quad (7)$$

wherein $R^{14}$ represents an alkyl group having from 9 to 16 carbon atoms, $R^{15}$ represents an alkylene group having from 2 to 4 carbon atoms, and r represents an integer of 6 to 16, and in another preferred embodiment of the present invention, the composition contains from 0.01 to 20 mass % of hydrogen peroxide.

Another embodiment of the present invention is a method for cleaning a semiconductor wafer, comprising (1) a cleaning step using the above-described cleaning agent composition and (2) a cleaning step using a cleaning agent containing an ammonia and a hydrogen peroxide. In a preferred embodiment, the cleaning step (1) performs degreasing of the semiconductor wafer surface and removal of particles thereon, and the cleaning step (2) performs removal of particles on the semiconductor wafer surface.

Another embodiment of the present invention is a semiconductor wafer having a surface cleaned by the above-described cleaning method. In a preferred embodiment, the number of particles of 0.2 μm or more adhering to the semiconductor wafer surface is 100 or less, and the semiconductor wafer is a silicon wafer, a gallium phosphide wafer, a gallium arsenide wafer or an indium phosphide wafer. In a more preferred embodiment, the semiconductor wafer is a silicon wafer and the surface roughness (Ra) thereof is 0.2 nm or less, or the semiconductor wafer is a gallium arsenide wafer and the surface roughness (Ra) thereof is 0.4 nm or less.

Another embodiment of the present invention is a method for manufacturing a semiconductor wafer, comprising (1) a lapping step of lapping the wafer surface, (2) a polishing step of specularly polishing the wafer surface and (3) a cleaning step using the above-described cleaning agent composition and a cleaning step using a cleaning agent containing an ammonia and a hydrogen peroxide.

DESCRIPTION OF THE PREFERRED EMBODIMENTS

The present invention is described in detail below.

At first, a cleaning agent composition of the present invention is described.

The cleaning agent composition of the present invention comprises a fluorine-containing anionic surfactant, a quaternary ammonium hydroxide and/or an alkanolamine.

The fluorine-containing anionic surfactant includes a fluorine-containing anionic surfactant which is at least one compound selected from the group consisting of carboxylic acids represented by the following formula (1):

$$R^1COOM \quad (1)$$

(wherein $R^1$ and M have the same meanings as defined above), salts thereof, sulfonic acids represented by the following formula (2):

$$R^2SO_3M \quad (2)$$

(wherein $R^2$ and M have the same meanings as defined above), and salts thereof.

The fluorine-containing anionic surfactant is preferably at least one compound selected from the group consisting of carboxylic acids represented by formula (1) wherein $R^1$ is a linear or branched perfluoroalkyl, hydrofluoroalkyl, perfluoroalkenyl or hydrofluoroalkenyl group having from 6 to 16 carbon atoms, salts thereof, sulfonic acids represented by formula (2) wherein $R^2$ is a linear or branched perfluoroalkyl, hydrofluoroalkyl, perfluoroalkenyl or hydrofluoroalkenyl group having from 6 to 12 carbon atoms, and salts thereof. Specific examples thereof include perfluoroheptanoic acid ($C_6F_3COOH$), perfluorocaprylic acid ($C_7F_{15}COOH$), perfluorononanoic acid ($C_8F_{17}COOH$), 5,5,6,6,7,7,8,8,9,9,9-undecafluorononanoic acid ($C_5F_{11}(CH_2)_3COOH$), perfluorocapric acid ($C_9F_{19}COOH$), perfluorododecanoic acid ($C_{11}F_{23}COOH$), 6,6,7,7,8,8,9,9,10,10,11, 11,12,12,12-pentadecafluoro-4-dodecenoic acid ($CF_3(CF_2)_6$ $CH=CH(CH_2)_2COOH$), perfluorotetra-decanoic acid ($C_{13}F_{27}COOH$), 12-trifluoromethyl-12,13,13,14,14,15,15, 16,16,16-decafluorohexadecanoic acid ($CF_3(CF_2)_3CF(CF_3)$ $(CH_2)_{10}COOH$), perfluorooctanesulfonic acid ($C_8F_{17}SO_3H$), and ammonium salts and tetramethylammonium salts thereof. Among these, preferred are perfluorocaprylic acid, perfluorocapric acid, perfluorooctanesulfonic acid and salts thereof. These compounds may be used individually or two or more thereof may be used in combination at an arbitrary ratio.

In the cleaning agent composition of the present invention, this fluorine-containing anionic surfactant is an essential component and contained in an amount of 0.0001 to 5 mass %, preferably from 0.0001 to 1 mass %, more preferably from 0.0001 to 0.5 mass %, based on the entire cleaning agent. If the content exceeds 5 mass %, bubbling or problem in the rinsing may disadvantageously arise, whereas if the content is less than 0.0001 mass %, the activity of improving the cleaning power cannot be sufficiently brought out.

The quaternary ammonium hydroxide is a compound represented by the following formula (3):

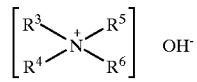 (3)

wherein $R^3$, $R^4$, $R^5$ and $R^6$ have the same meanings as defined above. Specific examples thereof include tetramethylammonium hydroxide (TMAH), trimethylhydroxyethylammonium hydroxide (choline), methyltrihydroxyethylammonium hydroxide, dimethyldihydroxyethylammonium hydroxide, tetraethylammonium hydroxide and trimethylethylammonium hydroxide. Among these, tetramethylammonium hydroxide and trimethylhydroxyethylammonium hydroxide are preferred. These quaternary ammonium hydroxides may be used individually, or two or more thereof may be used in combination at an arbitrary ratio. The quaternary ammonium hydroxide is contained in an amount of 0.001 to 30 mass %, preferably from 0.05 to 20 mass %, based on the entire cleaning agent. If the concentration exceeds 30 mass %, the wafer is excessively etched and this cannot be controlled, giving rise to problems such as roughening of the waver surface.

The alkanolamine is at least one compound selected from the group consisting of compounds represented by the following formula (4):

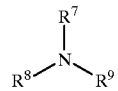 (4)

wherein $R^7$, $R^8$ and $R^9$ have the same meanings as defined above. Specific examples of the alkanolamine include monoethanolamine, diethanolamine and triethanolamine. Only one alkanolamine may be used alone or two or more thereof may be used in combination at an arbitrary ratio.

The cleaning agent composition of the present invention can be used as a cleaning agent containing two components of a fluorine-containing anionic surfactant and a quaternary ammonium hydroxide or as a cleaning agent containing two components of a fluorine-containing anionic surfactant and an alkanolamine, but is preferably used as a cleaning agent containing three components of a fluorine-containing anionic surfactant, a quaternary ammonium hydroxide and an alkanolamine, which is improved in the cleaning property and life. In the case of using an alkanolamine, the alkanolamine may be added in an amount of 0.01 to 20 mass %, preferably from 0.1 to 10 mass %, more preferably from 0.1 to 5 mass %, based on the entire cleaning agent. If the concentration thereof exceeds 20 mass %, a problem of reduction in the cleaning performance is caused and also, the profitability disadvantageously decreases.

For the purpose of preventing etching of the wafer surface, the cleaning agent composition of the present invention may further contain a nonionic surfactant, in addition to a fluorine-containing anionic surfactant, a quaternary ammonium hydroxide and an alkanolamine. The nonionic surfactant is suitably at least one compound selected from the group consisting of polyoxyalkylene alkyl ether compounds represented by the following formula (5):

 (5)

wherein $R^{10}$, $R^{11}$ and p have the same meanings as defined above, polyoxyalkylene aryl ether compounds represented by the following formula (6):

 (6)

wherein $R^{12}$, $R^{13}$ and q have the same meanings as defined above, and polyoxyalkylene alkyl ester compounds represented by the following formula (7):

 (7)

wherein $R^{14}$, $R^{15}$ and r have the same meanings as defined above.

The alkylene group in the above-described nonionic surfactant is preferably —$CH_2CH_2$— or —$CH_2CH_2CH_2$—, more preferably —$CH_2CH_2$—. Specific examples of the polyoxyalkylene alkyl ether compound include polyoxyethylene decanyl ether, polyoxyethylene undecanyl ether, polyoxyethylene dodecanyl ether and polyoxyethylene tetradecanyl ether. Specific examples of the polyoxyalkylene aryl ether compound include polyoxyethylene nonylphenyl ether, polyoxyethylene octylphenyl ether and polyoxyethylene dodecylphenyl ether. Specific examples of the polyoxyalkylene alkyl ester compound include polyoxyethyleneoleic acid ester. However, the nonionic surfactant is not limited thereto.

This nonionic surfactant can be added in the range from 0.0001 to 5 mass %, preferably from 0.0001 to 1 mass %, more preferably from 0.0001 to 0.5 mass %, based on the entire cleaning agent. If the nonionic surfactant is used in excess of 5 mass %, bubbling or a problem in the rinsing may disadvantageously arise.

The cleaning agent composition of the present invention may further contain a hydrogen peroxide. In the cleaning of a silicon wafer, the wafer can be prevented from etching by the addition of only a surfactant to an alkali. However, the effect is greatly affected by the kind of the surfactant, the alkali concentration and the temperature, and a sufficiently high effect is not always obtained in all possible conditions. By using a hydrogen peroxide, the etching can be appropriately controlled even at high temperatures and the cleaning agent composition of the present invention can be broadened in the range of use.

In the case of adding a hydrogen peroxide, the hydrogen peroxide may be added in the range from 0.01 to 20 mass %, preferably from 0.05 to 10 mass %, based on the entire cleaning agent. If the hydrogen peroxide concentration exceeds 20 mass %, the amount of hydrogen peroxide decomposed increases and this is not profitable, although the cleaning power itself is not particularly affected.

The components constituting the cleaning agent of the present invention are fundamentally a fluorine-containing anionic surfactant, a quaternary ammonium hydroxide and/or an alkanolamine. By using the cleaning agent in which these fundamental components are combined according to the use conditions, the removal of contamination on the wafer surface and the prevention of re-adhesion of the contaminant can be performed with good efficiency. Depending on the use conditions, the nonionic surfactant or hydrogen peroxide is added at an appropriate time to prevent etching on the wafer surface by an alkali. For example, in the cleaning of a silicon wafer, when the cleaning agent is used at a high temperature, for example at 60 to 80° C., the etching of the wafer by an alkali excessively proceeds. Therefore, a hydrogen peroxide is preferably added. On the other hand, when the cleaning agent of the present invention is used at an ordinary temperature, a nonionic surfactant may be added in place of a hydrogen peroxide, or both a hydrogen peroxide and a nonionic surfactant may be added. The etching of a wafer varies in degree depending on the kind of the wafer. For example, in the cleaning of a gallium arsenide wafer, the etching activity of an alkali on the wafer surface is extremely small, and therefore, a nonionic surfactant or a hydrogen peroxide may not be added depending on the use conditions. The cleaning agent composition of the present invention exhibits excellent cleaning effect, needless to say, at an ordinary temperature, but can also be suitably used in the cleaning under appropriate heating or cleaning using ultrasonic waves. In addition, the cleaning agent composition of the present invention can remove the surface contamination not only of a semiconductor wafer, but also of a precisely worked instrument made of glass, ceramic or the like, which is used in the manufacture of a wafer.

A method for cleaning a semiconductor wafer of the present invention is described below.

The method for cleaning a semiconductor wafer of the present invention comprises (1) a cleaning step of using the above-described cleaning agent composition and (2) a cleaning step of using a cleaning agent containing an ammonia and a hydrogen peroxide. The cleaning step (1) has a purpose mainly of degreasing the semiconductor wafer surface and removing particles thereon, and the cleaning step (2) has a purpose mainly of removing particles on the semiconductor wafer surface.

A representative example of the step of performing the degreasing of the semiconductor wafer surface and removal of particles thereon includes a wax cleaning after the specular polishing of wafer. The specular polishing of a semiconductor wafer is performed by adhering and fixing the wafer to a plate (jig) with wax. Therefore, a large amount of wax used as an adhesive remains adhered to the wafer when the wafer is stripped off from the plate after the completion of polishing. The cleaning agent composition of the present invention is particularly effective in cleaning to remove these wax and particles adhering to the wafer.

The cleaning agent composition of the present invention has both a wax-removing effect and a particle-removing effect even if the composition is used alone; however, it may be used in combination with other cleaning agents. A cleaning method of performing a cleaning step for removing wax and particles on a semiconductor wafer using the cleaning agent composition of the present invention and further performing a cleaning step for removing particles using a cleaning agent having other compositions, is described below. At first, a cleaning step for removing wax and particles is performed using a cleaning agent of the present invention obtained by adding perfluorocaprylic acid to an aqueous tetramethylammonium hydroxide solution. To this cleaning agent, a hydrogen peroxide can be added, if desired. Thereafter, a cleaning step for removing particles is performed using a cleaning agent containing an ammonia and a hydrogen peroxide. Each cleaning step may be performed multiple times. A rinsing step using, for example, water may also be performed. After the completion of all cleaning steps, the wafer is dried using an organic solvent such as isopropyl alcohol. The thus-cleaned semiconductor wafer is not only free of wax, but also is reduced in the particle level as compared with the case of using conventional cleaning solutions.

In the above-described two cleaning steps, the cleaning temperature, the cleaning conditions and the like are not particularly limited and appropriate conditions can be properly selected depending on the wafer to be cleaned. Examples of the semiconductor wafer which can be cleaned using the cleaning method of the present invention include one-element semiconductors such as silicon and germanium, and compound semiconductors such as gallium phosphide, gallium arsenide and indium phosphide.

Another embodiment of the present invention is a semiconductor wafer cleaned by the above-described cleaning method, reduced in the number of particles adhering to the wafer surface and having a small surface roughness (Ra). The number of particles adhering to the wafer surface is 100 or less in terms of particles having a particle size of 0.2 $\mu$m or more. This number of particles is not limited by the size of wafer. The surface roughness (Ra) varies depending on the kind of wafer and it is 0.2 nm or less in the case of a silicon wafer and 0.4 nm or less in the case of a gallium arsenide wafer.

A method for manufacturing a semiconductor wafer of the present invention is described below. Although a method for manufacturing a silicon wafer is described here, the present invention is not limited to the manufacturing method of silicon wafer.

The method for manufacturing a semiconductor wafer of the present invention is comprises a lapping step of lapping the wafer surface, a polishing step of specularly polishing the wafer surface, and a cleaning step. First, a silicon single crystal is drawn up and the ingot drawn up is cut into a wafer through grinding of outer periphery and working of orientation flatting. The thus-obtained wafer is transferred to a beveling (side polishing), to a lapping (surface polishing) step and then a to polishing (specular polishing) step. In the specular polishing, the wafer is bonded and fixed to a plate (jig) made of glass or ceramic using a wax (adhesive) and the wafer surface is polished with an abrasive and an abrasive cloth. After the completion of specular polishing, the wafer is stripped off from the plate and transferred to a cleaning step to remove wax or particles adhering to the wafer surface or remove contamination such as metal impurities. This cleaning step comprises (1) a cleaning step of using the above-described cleaning agent composition and (2) a cleaning step of using a cleaning agent containing an ammonia and a hydrogen peroxide. After the completion of cleaning, the wafer surface is inspected and the wafer is used as a product.

EXAMPLES

The present invention is described in greater detail below by referring to the Examples and Comparative Examples, however, the present invention should not be construed as being limited thereto. Unless otherwise indicated herein, all parts, percents, ratios and the like are by weight.

Example 1

Wettability

A contact angle of an aqueous solution of a cleaning agent containing 0.35 mass % of TMAH and 100 ppm of perfluorocaprylic acid to a silicon wafer or a gallium arsenide wafer was measured. The results are shown in Table 1.

Comparative Example 1

A contact angle of an aqueous solution of a cleaning agent containing 0.35 mass % of TMAH to a silicon wafer or a gallium arsenide wafer was measured. The results are shown in Table 1.

TABLE 1

| | TMAH | Example 1 0.35 mass % | Comparative Example 1 0.35 mass % |
|---|---|---|---|
| Additive | Perfluorocaprylic acid | 100 ppm | — |
| Contact | Silicon wafer | 48° | 60° |
| Angle | Gallium arsenide wafer | 7° | 14° |

From the measurement results of the contact angle shown in Table 1, it can be seen that by adding perfluorocaprylic acid to an aqueous solution of a cleaning agent containing TMAH, the cleaning agent was improved in the wettability to a silicon wafer and a gallium arsenide wafer.

Example 2

Wax Removability

A commercially available wax (Alpha Liquid TR-100, trade name (produced by Ink Tech Co.)) was coated on the surface of a 4-inch gallium arsenide wafer to a film thickness of 1.7 μm, and this wafer was baked at 80° C. for 5 minutes to manufacture a test wafer.

The test wafer was dipped in a cleaning agent composition shown in Table 2 at 25° C. for 6 minutes, rinsed with ultrapure water for 6 minutes, and then dried. After the treatment, a condensing lamp was irradiated on the wafer surface and the wax removability was examined with a naked eye. The results are shown in Table 2. The evaluation was performed according to three-stage criteria, that is, ○: wax was completely removed, Δ: wax partially remained, and X: wax remained throughout the wafer surface.

Comparative Examples 2 and 3

Test wafers manufactured in the same manner as in Example 2 each was dipped in a cleaning agent composition shown in Table 2. Then, the wafers were treated in the same manner as in Example 2 and then examined on the wax removability. The results are shown in Table 2.

TABLE 2

| | TMAH | Example 2 0.16 mass % | Comparative Example 2 0.16 mass % | Comparative Example 3 0.16 mass % |
|---|---|---|---|---|
| Additives | Polyoxyethylene nonylphenyl ether | — | — | 100 ppm |
| | Perfluorocaprylic acid | 100 ppm | — | — |
| Test Results | | ○ | Δ | Δ |

From the test results shown in Table 2, it can be seen that the cleaning agent obtained by adding perfluorocaprylic acid to an aqueous TMAH solution is more improved in wax removability than the cleaning agent obtained by adding polyoxyethylene nonylphenyl ether, which is used in many cases for cleaning semiconductors.

Example 3

Particle Removability (1) (Gallium Arsenide Wafer Cleaning Test)

In the process of manufacturing a 4-inch gallium arsenide wafer, a wafer passed through a lapping step and an etching step was bonded and fixed to a glass plate using a commercially available wax (Alpha Liquid TR-100, trade name, (produced by Ink Tech Co.)), and the wafer surface was specularly polished with an abrasive and an abrasive cloth. After the completion of specular polishing, the wafer was stripped off from the plate and used as a test wafer.

To an aqueous solution containing 3.2 mass % of TMAH and 12.8 mass % of diethanolamine, perfluorocaprylic acid was added to a concentration of 2,000 ppm, and this solution was 20-fold diluted with ultrapure water and then subjected to a cleaning test of removing particles of gallium arsenide wafer.

In the cleaning test, the test wafer was dipped in the diluted cleaning solution at 25° C. for 9 minutes and then rinsed in ultrapure water at 25° C. for 6 minutes. Thereafter, the wafer was dried for 1 minute using an IPA drier. After the cleaning, the particle level (unit: particles/wafer, n=9) on the wafer surface was measured. The results are shown in Table 3.

Comparative Example 4

To an aqueous solution containing 3.2 mass % of TMAH and 12.8 mass % of diethanolamine, polyoxyethylene nonylphenyl ether was added to a concentration of 2,000 ppm, this solution was 20-fold diluted with ultrapure water and then subjected to a cleaning test of gallium arsenide wafer was performed in the same manner as in Example 3. After the cleaning, the particle level (unit: particles/wafer, n=9) on the wafer surface was measured. The results are shown in Table 3.

TABLE 3

| | 0.2 to 0.3 μm | 0.3 μm ≤ | Total, 0.2 ≤ |
|---|---|---|---|
| Example 3 | 173.4 | 2.8 | 176.2 |
| Comparative Example 4 | 413.0 | 7.8 | 420.8 |

From the measurement results of the particle level shown in Table 3, it can be seen that in Example 3, where the wafer is cleaned using an aqueous solution obtained by adding perfluorocaprylic acid to TMAH and diethanolamine, the number of particles adhering to the wafer surface can be reduced as compared with Comparative Example 4, where polyoxyethylene nonylphenyl ether (a commonly used surfactant) is used.

Example 4

Particle Removability (2) (Silicon Wafer Cleaning Test)

In the process of manufacturing a 6-inch silicon wafer, a wafer passed through a lapping step and an etching step was bonded and fixed to a glass plate using a commercially available wax (Alpha Liquid TR-120, trade name (produced by Ink Tech Co.)), and the wafer surface was specularly polished with an abrasive and an abrasive cloth. After the completion of specular polishing, the wafer was stripped off from the plate and used as a test wafer.

A solution obtained by adding perfluorocaprylic acid to an aqueous solution containing 1.3 mass % of TMAH to have a concentration of 100 ppm was 22-fold diluted with ultra-pure water. Aqueous hydrogen peroxide (a 30 mass % aqueous solution) was added thereto to have a concentration of 3 mass %, and this solution was used for a cleaning test for removing particles on the silicon wafer surface.

In the cleaning test, the test wafer was dipped in the above-described cleaning solution heated to 75° C. for 6 minutes and then rinsed in ultrapure water at 25° C. for 6 minutes. The wafer was further cleaned using a cleaning solution containing an ammonia and a hydrogen peroxide at 75° C. for 6 minutes and then rinsed in ultrapure water at 25° C. for 6 minutes. Thereafter, the wafer was dried for 1 minute using an IPA drier. After the cleaning, the particle level (unit: particles/wafer, n=25) on the wafer surface was measured. The results are shown in Table 4.

TABLE 4

| Particle Level | Number of Particles |
| --- | --- |
| 0.2 to 0.3 μm | 7.2 |
| 0.3 to 0.5 μm | 1.4 |
| 0.5 to 1.5 μm | 0.9 |
| 1.5 to 1.8 μm | 0.5 |
| Total, 0.2 to 1.8 μm | 10.0 |

From the measurement results shown in Table 4, it was verified that when the wafer is cleaned with a cleaning solution obtained by adding perfluorocaprylic acid and hydrogen peroxide to an aqueous TMAH solution, and further cleaned with a cleaning solution containing an ammonia and a hydrogen peroxide, the number of particles of 0.2 μm or more can be lowered to the level of about 10 particles.

Example 5

Activity of Etching Silicon Wafer

A 6-inch silicon wafer was dipped in a cleaning agent composition shown in Table 5 at 60° C. for 5 minutes, rinsed with ultrapure water for 6 minutes and then dried. The roughness on the wafer surface after the cleaning test was measured using an atomic force microscopy. The results are shown as the wafer surface roughness (Ra) in Table 5.

Comparative Example 6

A 6-inch silicon wafer was cleaned in the same manner as in Example 5 using a cleaning agent containing 0.13 mass % of TMAH and the wafer surface roughness after the cleaning test was measured using an atomic force microscopy. The results are shown in Table 5.

TABLE 5

| | TMAH | Example 5 0.13 mass % | Comparative Example 6 0.13 mass % |
| --- | --- | --- | --- |
| Additive | Perfluorocaprylic acid | 100 ppm | — |
| | Hydrogen peroxide | 1 mass % | — |
| | Wafer surface roughness (Ra) | 0.12 nm | (>0.4 nm) |

* Wafer used: (100) mirror face wafer
* Surface roughness (Ra) of untreated wafer used for measurement = about 0.12 nm From the measurement results of surface roughness of silicon wafer shown in Table 5, it was verified that in Example 5, which used the cleaning agent of present invention, the wafer surface roughness after the cleaning is 0.12 nm, and the wafer surface roughness due to etching was in a level having no problem.

Example 6

Activity of Etching Gallium Arsenide Wafer

A 4-inch gallium arsenide wafer was subjected to an etching activity test in the same manner at 25° C. using a cleaning agent composition shown in Table 6 and the wafer surface roughness after the test was measured. The results are shown in Table 6.

TABLE 6

| | TMAH | 0.1 mass % |
| --- | --- | --- |
| Additive | Perfluorocaprylic acid | 100 ppm |
| | Hydrogen peroxide | — |
| | Wafer surface roughness (Ra) | 0.28 nm |

* Wafer: (100) mirror face wafer
* Surface roughness (Ra) of untreated wafer used for measurement = about 0.24 nm From the measurement results of surface roughness of a gallium arsenide wafer shown in Table 6, it can be seen that the wafer surface roughness only slightly increases due to cleaning.

By using the cleaning agent composition of the present invention, contaminants on the surface of a semiconductor wafer or an instrument made of glass or ceramic, which is used in the manufacture of wafer, can be swiftly removed within a relatively short time. Particularly, the cleaning agent composition of the present invention exhibits high cleaning power for wax, satisfactorily controls the etching activity and ensures very excellent surface condition after the cleaning treatment.

While the invention has been described in detail and with reference to specific embodiments thereof, it will be apparent to one skilled in the art that various changes and modifications can be made therein without departing from the spirit and scope thereof.

What is claimed is:

1. A cleaning agent composition comprising (A) from 0.0001 to 5 mass % of a fluorine-containing anionic surfactant and at least one of (B) from 0.001 to 30 mass % of a quaternary ammonium hydroxide and (C) from 0.01 to 20 mass % of an alkanolamine; wherein the fluorine-containing anionic surfactant is at least one compound selected from the group consisting of (i) carboxylic acids or salts thereof represented by the following formula (1):

$$R^1 COOM \tag{1}$$

wherein $R^1$ represents a linear or branched alkyl group or alkenyl group having from 2 to 20 carbon atoms, with a part or all of the hydrogen atoms being substituted by fluorine atom, and M is selected from the group consisting of hydrogen atom, an alkali metal atom, an ammonium group, an alkylammonium group and an alkanolammonium group, (ii) sulfonic acids or salts thereof represented by the following formula (2):

$$R^2 SO_3 M \quad (2)$$

wherein $R^2$ represents a linear or branched alkyl group or alkenyl group having from 2 to 20 carbon atoms, with a part or all of the hydrogen atoms being substituted by fluorine atom, and M has the same meaning as defined above.

2. The cleaning agent composition as claimed in claim 1, wherein the fluorine-containing anionic surfactant is at least one compound selected from the group consisting of perfluorocaprylic acid, perfluorocapric acid, perfluorooctanesulfonic acid, and salts thereof.

3. The cleaning agent composition as claimed in claim 1, wherein the quaternary ammonium hydroxide is at least one compound selected from the group consisting of compounds represented by the following formula (3):

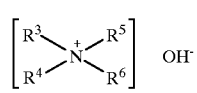
(3)

wherein $R^3$, $R^4$, $R^5$ and $R^6$, which may be the same or different, each independently represents an alkyl group having from 1 to 6 carbon atoms or a hydroxyalkyl group.

4. The cleaning agent composition as claimed in claim 1, wherein the quaternary ammonium hydroxide is tetramethylammonium hydroxide.

5. The cleaning agent composition as claimed in claim 1, wherein the alkanolamine is at least one compound selected from the group consisting of compounds represented by the following formula (4):

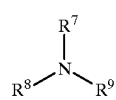
(4)

wherein $R^7$ represents a hydroxyalkyl group having from 1 to 4 carbon atoms, $R^8$ and $R^9$, which may be the same or different, each independently represents a hydrogen atom, an alkyl group having from 1 to 4 carbon atoms, a hydroxyalkyl group having from 1 to 4 carbon atoms or an aminoalkyl group having from 1 to 4 carbon atoms, and $R^8$ and $R^9$ may combine to represent an alkylene group having from 3 to 6 carbon atoms, which may be interrupted by an oxygen atom or a nitrogen atom.

6. The cleaning agent composition as claimed in claim 1, wherein the alkanolamine is at least one compound selected from the group consisting of monoethanolamine, diethanolamine and triethanolamine.

7. The cleaning agent composition as claimed in claim 1, which contains from 0.0001 to 5 mass % of a nonionic surfactant.

8. The cleaning agent composition as claimed in claim 1, wherein the nonionic surfactant is at least one compound selected from the group consisting of (i) polyoxyalkylene alkyl ether compounds represented by the following formula (5):

$$R^{10}—O—(R^{11}—O)_p—H \quad (5)$$

wherein $R^{10}$ represents an alkyl group having from 6 to 20 carbon atoms, $R^{11}$ represents an alkylene group having from 2 to 4 carbon atoms, and p represents an integer of 3 to 20, (ii) polyoxyalkylene aryl ether compounds represented by the following formula (6):

$$R^{12}—C_6H_4—O—(R^{13}—O)_q—H \quad (6)$$

wherein $R^{12}$ represents an alkyl group having from 6 to 20 carbon atoms, $R^{13}$ represents an alkylene group having from 2 to 4 carbon atoms, and q represents an integer of 3 to 20, and (iii) polyoxyalkylene alkyl ester compounds represented by the following formula (7):

$$R^{14}—COO—(R^{15}—O)_r—H \quad (7)$$

wherein $R^{14}$ represents an alkyl group having from 9 to 16 carbon atoms, $R^{15}$ represents an alkylene group having from 2 to 4 carbon atoms, and r represents an integer of 6 to 16.

9. The cleaning agent composition as claimed in claim 1, which contains from 0.01 to 20 mass % of hydrogen peroxide.

10. A method for cleaning a semiconductor wafer, comprising the following cleaning steps:
   (1) cleaning using the cleaning agent composition described in any one of claims 1, and 3 to 10; and
   (2) cleaning using a cleaning agent containing ammonia and hydrogen peroxide.

11. The method for cleaning a semiconductor wafer as claimed in claim 10, wherein in the cleaning step (1), the semiconductor wafer surface is degreased and particles thereon are removed.

12. The method for cleaning a semiconductor wafer as claimed in claim 10, wherein in the cleaning step (2), particles on the semiconductor wafer surface are removed.

13. A method for manufacturing a semiconductor wafer, comprising the following steps:
   (1) lapping the water surface;
   (2) specularly polishing the wafer surface; and
   (3) cleaning using the cleaning agent composition described in any one of claims 1 and 3–10 and cleaning using a cleaning agent containing ammonia and hydrogen peroxide.

* * * * *